United States Patent [19]
Wong

[11] Patent Number: 5,550,513
[45] Date of Patent: Aug. 27, 1996

[54] HIGH FREQUENCY, DIFFERENTIAL LIMITING DISTRIBUTED AMPLIFIER

[75] Inventor: Thomas Y. Wong, Nepean, Canada

[73] Assignee: Northern Telecom Limited, Montreal, Canada

[21] Appl. No.: 493,600

[22] Filed: Jun. 22, 1995

[51] Int. Cl.⁶ .................................................. H03F 3/60
[52] U.S. Cl. ............................................. 330/286; 330/54
[58] Field of Search ................................. 330/53, 54, 55, 330/286, 295

[56] References Cited

U.S. PATENT DOCUMENTS

| | | | |
|---|---|---|---|
| 3,661,443 | 5/1972 | Harris et al. | 330/55 |
| 4,486,719 | 12/1984 | Ayasli | 330/286 |
| 4,540,954 | 9/1985 | Apel | 330/286 |
| 4,595,881 | 6/1986 | Kennan | 330/54 |
| 5,365,197 | 11/1994 | Ikalainen | 330/286 |

OTHER PUBLICATIONS

"A Low Noise Distributed Amplifier With Gain Control", Hutchison et al., IEEE MIT-S Digest, 1987, pp. 165–168.
"2–20 GHz GaAs Traveling-Wave Power Amplifier", Ayasli et al., IEEE Transactions on Microwave Theory and Techniques, vol. MTT-32, No. 3, Mar. 1984, pp. 290–295.
"A DC–12 GHz Monolithic GaAsFET Distributed Amplifier", IEEE Transactions on Microwave Theory and Techniques, vol. MTT-30, No. 7, Jul. 1982, pp. 969–975.

*Primary Examiner*—Steven Mottola
*Attorney, Agent, or Firm*—George MacGregor

[57] ABSTRACT

A fully differential distributed amplifier for providing a high frequency, high power output. The inherent base-collector capacitance of the output power transistors of each distributed amplifier is matched with on-chip inductances to create artificial transmission lines for both the input and output paths. The distributed amplifier circuit may be used as a driver for a Mach-Zehnder optical modulator. In this application an output of 3 V peak-to-peak per modulator arm is delivered at 10 Gb/s.

13 Claims, 5 Drawing Sheets

HIGH FREQUENCY, DIFFERENTIAL LIMITING DISTRIBUTED AMPLIFIER

FIELD OF INVENTION

This invention relates to a fully differential, limiting distributed amplifier for providing a high frequency, high power output. More particularly, the invention relates to a driver for a III–V Mach-Zehnder modulator operating at 10 Gb/sec or more.

BACKGROUND OF THE INVENTION

The electronics community generally, and the telecommunications industry particularly, are constantly striving for higher frequencies of operation. In order to meet the expected demand for broadband communications such as in-home, high density video and interactive computer services, it is necessary to develop reliable methods of modulating signals in the 10 Gb/s range. One device which is capable of this is a Mach-Zehnder phase modulator, based on an interferometric configuration, which converts phase modulation into intensity modulation. The phase of the optical beam travelling through a first arm of the interferometer is altered relative to the phase in the second arm by applying an appropriate modulating voltage to an electrode associated with the first arm. In one such configuration the modulating voltage is applied to each arm in an equal, push-pull relationship for optimum power utilization. A III–V Mach-Zehnder modulator requires up to three volts peak-to-peak per arm at the modulating frequency for equal push-pull operation. Silicon, the traditional material for integrated circuits, is unable to satisfactorily meet these high speed requirements and, as a result, III–V alloy devices such as GaAs MESFETs have been utilized.

PRIOR ART

The high-frequency, high-gain characteristics of GaAs MESFETs have renewed interest in distributed amplifiers as a means of amplifying a high frequency signal.

U.S. Pat. No. 4,486,719 which issued Dec. 4, 1984, to Yalcin Ayasli, discloses a MESFET distributed amplifier arrangement for amplifying radio frequency signals. The arrangement includes a plurality of cascade interconnected field effect transistors.

U.S. Pat. No. 4,595,881 which issued Jun. 17, 1986, to Wayne Kennan, teaches a distributed amplifier using dual-gate GaAs FETs. The patent indicates an operational frequency range of 2–18 Ghz.

U.S. Pat. No. 5,365,197 which issued Nov. 15, 1994, to Pertti K. Ikalainen, discusses a low-noise distributed amplifier utilizing FETs or GaAs HEMTs. This distributed amplifier is also intended for high frequency applications.

The aforementioned references relate to a distributed amplifier having a single ended output. These are not suitable or providing a drive voltage into a push-pull configuration such as is required to drive a Mach-zehnder.

Hutchman et al, in "A Low Noise Distributed Amplifier with Gain Control", IEEE MTT-S Digest 1987, disclose a monolithic GaAs distributed amplifier operable on the 2 to 18 GHz range. Dual outputs are obtained by twining two similar circuits. This method of obtaining dual outputs is inherently susceptible to noise such as power supply noise, common mode noise and ground noise.

SUMMARY OF THE INVENTION

The present invention relates to a distributed amplifier that is fully differential.

The present invention also relates to a differential distributed amplifier wherein the input and output stages are limited, thereby providing an output which is insensitive to input amplitude variations. The limiting nature of the distributed amplifier also results in a flat passband gain and well-behaved high frequency roll-off. The differential nature of the amplifier inherently produces good common mode rejection ratio (CMRR) and a good power supply rejection ratio (PSRR).

Therefore in accordance with the present invention there is provided a fully differential, limiting, distributed amplifier circuit for supplying a high frequency differential output. In a preferred embodiment the differential output is used to drive a Mach-Zehnder optical modulator in a dual arm, push-pull configuration.

The distributed amplifier circuit comprises a plurality of interconnected distributed amplifier stages, each having input means to receive a high frequency input signal. The distributed amplifier stages provide individual differential outputs, which outputs are summed with the outputs of succeeding distributed amplifier stages to provide an amplified, differential output. A pair of input transmission lines are provided to transfer the high frequency input signal to each of the distributed amplifier stages. The circuit also has a pair of output transmission lines connected to each of the distributed amplifier stages to deliver the summed, differential output to appropriate output terminals. Biasing means are provided to supply a d.c. bias current to the distributed amplifier stages for controlling the amplitude of the high frequency differential output.

In a preferred embodiment the distributed amplifier circuit has an integrated input amplifier for receiving the input signal and generating a differential signal for the distributed amplifier stages.

It is also contemplated that each distributed amplifier stage will contain one or more gain block(s) connected (in parallel) to provide the differential output from each stage.

The circuit according to a preferred embodiment is fabricated in AlGaAs/GaAs utilizing an HBT process. It is contemplated, however, that other materials such as Si:Ge or InGaP/GaAs can be used. It also contemplated that the integrated circuit can be fabricated utilizing MESFET or HEMT processes.

Although a preferred application for the amplifier of this invention is as a driver for a Mach-Zehnder optical modulator, it is to be understood that use is not restricted to such application.

BRIEF DESCRIPTION OF THE DRAWINGS

The invention will now be described in greater detail with reference to the attached drawings wherein.

DETAILED DESCRIPTION OF THE INVENTION

The integrated distributed amplifier circuit of a preferred embodiment of the present invention includes an input or front end stage and an output stage to provide the amplified differential output. The input and output stages are interconnected by transmission lines. It is to be understood, however, that an integrated front end or input stage is not essential to the invention. The differential, high frequency input to the distributed amplifier stages can be provided off-chip by other means. It is also contemplated that the input can be driven single-ended by driving one input and holding the other input at a d.c. reference level. The amplitude of the swing of the input signal will also determine whether the distributed amplifier stages are linear or limited. To simplify the description the various elements of the circuit will be considered separately.

Figure 1:
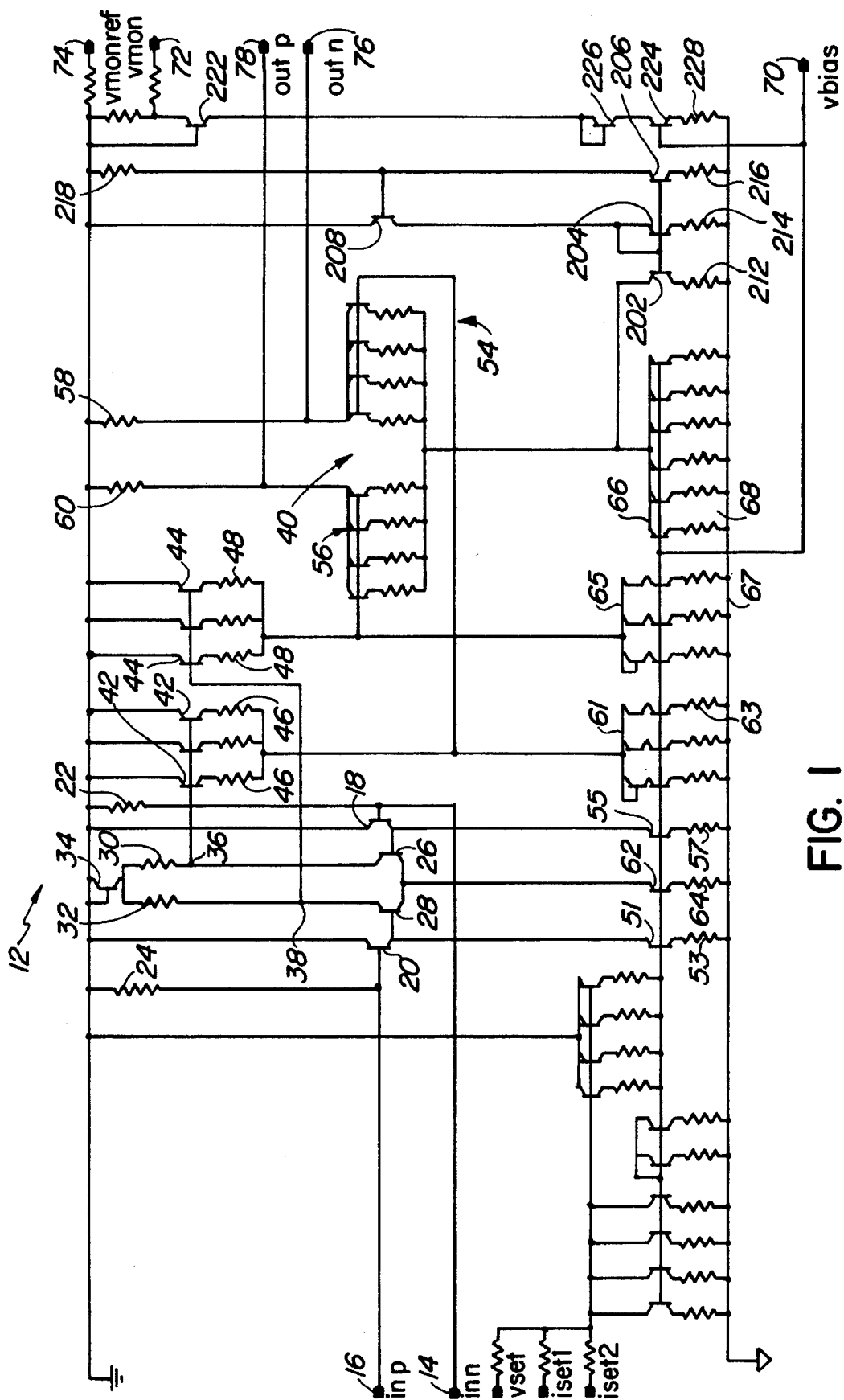
FIG. 1 is a circuit diagram of the input amplifier stage.

FIG. 1 is a circuit diagram of the front end or input stage 12. The differential high frequency input inn and inp is connected to input terminals 14 and 16 respectively. The differential inputs inn and inp are buffered by emitter followers 18 and 20 respectively. The inputs are also terminated on chip by 50 ohm resisters 22 and 24. The outputs of transistor 18 and 20 drive the first differential pair 26 and 28 and lead resisters 30 and 32. Transistor 34 provides level shifting to avoid the second differential stage 40 from running into saturation. The outputs 36,38 of the first differential pair drive the lumped emitter followers shown at 42 and 44. Resisters 46 and 48 are ballasting resisters to prevent thermal instability of the lumped emitter followers 42 and 44. The outputs 50 and 52 of emitter followers 42 and 44 respectively drive the second differential stage 40.

The second differential stage 40 includes lumped transistors 54 and 56 and output lead resisters 58 and 60 respectively. Current sources 62 and 64 and lumped sources 66 and 68 form the current mirrors feeding the first differential pair 26,28 and second differential stage 40 respectively. Current mirror 51,53 drives emitter follower 20 and mirror 55,57 drives emitter follower 18. Similarly lumped current mirror 61,63 drives emitter follower 42,46 and current mirror 65,67 drives emitter follower 44,48. A d.c. bias voltage to be discussed later is taken off at terminal 70 and a monitoring voltage and monitoring reference voltage are provided at terminals 72 and 74 respectively. The outputs 76,78 of the second differential stage 40 drive the input transmission lines of the distributed amplifier stage through two on-chip 50 ohm coplanar waveguides (not shown).

The incorporation of the front end or input stage on the same I.C. as the distributed amplifier stage provides some distinct advantages. Small input transistors at the front-end generally result in respectable input return loss. It also provides extra gain in a separate gain block, avoiding the need to have all the gain designed into the distributed amplifier. This minimizes stability problems associated with high gain distributed amplifiers. Since the output swing of the front end is small, a simple lumped circuit is sufficient for the purpose. The total gain of the front end is in the range 2× to 3.3×. In the preferred embodiment having the integrated input stage, the output from the front end is ideally 1 V peak-to-peak for a 3 V swing in the output of the distributed amplifier. Thus, if the swing of the input signal to the front end is 0.5 V, the gain in the input stage needs to be 2. A 0.3V input swing in the signal to the front end requires a gain of 3.3 and an input swing of 0.1 V requires a gain of 10. In reality a gain of 10 is close to the maximum.

AS discussed previously, an important application for the I.C. of this invention is as a driver for a III–V Mach-Zehnder modulator at 10 Gb/s. It is contemplated, however, that the I.C. can be used to drive other 50 ohm systems as well. In any event, the specifications of a III–V Mach-Zehnder require up to a 3 V swing per output into a 50 ohm load. Thus, the drive current at the output stage must deliver 120 mA, with 60 mA drive an on-chip 50 ohm termination and 60 mA driving an off-chip 50 ohm load. The lumped output circuit as used in the front end stage was found to be unacceptable under the specified output conditions due to the large base-collector capacitance of the parallel output transistors. This parasitic capacitance reduces speed and degrades the output return loss at high frequencies.

To overcome these limitations the output stage has been designed with output transistors divided into stages and inductors with inductance, L are used to connect the stages together. The inductance L can also be achieved with a transmission line with an equivalent L and C where C=output capacitance per stage. Since the base-collector capacitance off the power transistors per stage is now smaller, its parasitic is easier to deal with. If $$\sqrt{\frac{L}{C}}$$

is made equal to 50 ohms where L=inductance and C=equivalent output capacitance per stage it is possible to construct a 50 ohm transmission line from these stages with gain provided by the output transistors. As long as the cut-off frequency of this artificial transmission line given by $$\frac{1}{\pi\sqrt{LC}}$$

is high compared to the operating frequency of 10 GHz, the speed and output return loss will not impose imitations. Additionally the on-chip 50 ohm transmission line provides good matching with the off-chip 50 ohm system.

Due to the transmission line nature of each output stage, there is an inherent delay (td) associated with it. The delay is given by $td=\sqrt{LC}$.

In order for the output currents of each stage to be summed together at the output the switching of the output current at the $(n+1)^{th}$ stage must be delayed by the amount td with respect to the $n^{th}$ stage. (n is an integer, n=1,2,3 or 4 for a five-stage distributed amplifier. ) This can be achieved if the input signal of the $(n+1)^{th}$ stage is also delayed by td with respect to the $n^{th}$ stage. Therefore the input stage will always have a transmission line structure.

Figure 2:
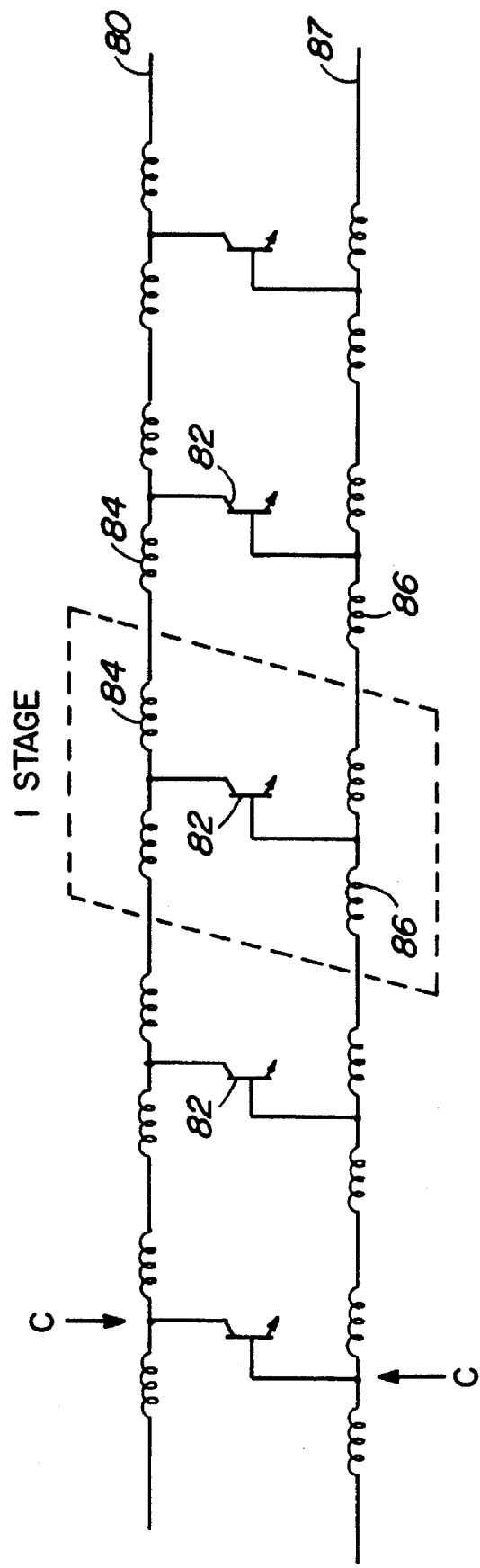
FIG. 2 is a circuit diagram of a basic, five-stage single ended distributed amplifier.

FIG. 2 represents the basic distributed amplifier circuit with a single ended output at 80. The dotted parallelogram depicts a single stage of a five-stage distributed amplifier. As shown power transistors 82 are connected in cascade with inductors 84 in the output transmission line and inductors 86 in the input transmission line 87. The value of C is a function of the base-collector capacitance which may be augmented with an on-chip capacitance if required.

Figure 3:
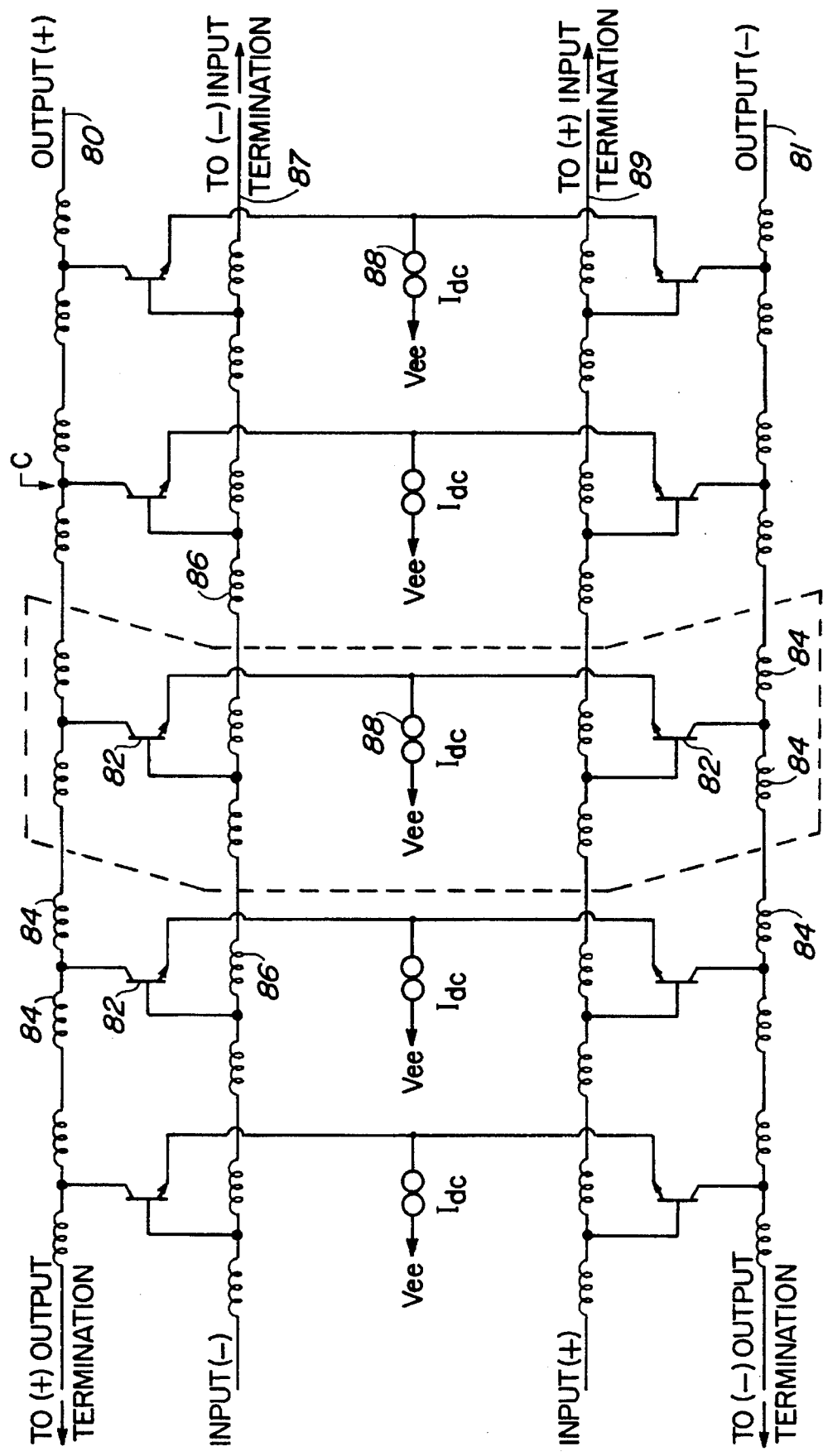
FIG. 3 is a circuit diagram of a basic five-stage differential distributed amplifier.

FIG. 3 illustrates the basic structure of FIG. 2 in a differential configuration. As shown the emitters of each pair of transistors 82 in a stage (shown in dotted line) are connected in a common emitter format and supplied by a constant current source 88. The collectors are tied to the output transmission line 80,81 and the base of each transistor is joined to the common input transmission lines 87,89.

A detailed description of the distributed amplifier will now be given with reference to FIG. 4 which is a circuit diagram off a pair off gain blocks which make up one distributed amplifier stage. As shown, the two gain blocks 100 and 102 are connected in parallel. It is to be understood, however, that each distributed amplifier stage may comprise a single gain block or more than two. For the purposes of driving a III–V Mach-Zehnder it was determined that five distributed amplifier stages each having a pair of gain blocks were sufficient. Each stage provides a voltage gain of approximately 0.6. Thus for a voltage swing of 500 mV in the input signal to the front end and a gain of 2× in the input stage, a swing of 1 V is provided to the distributed amplifier. A gain of 0.6 per stage gives 3 V swing after five stages.

It will be apparent that the number of stages or gain blocks required in the distributed amplifier will depend on the requirements of the load. The maximum output voltage swing is limited by the number of stages that can be cascaded without losing bandwidth. This is determined by the resistive loss accumulation along the transmission line although pole crowding at $$\frac{1}{\pi\sqrt{LC}}$$

also contributes to this limitation.

Figure 4:
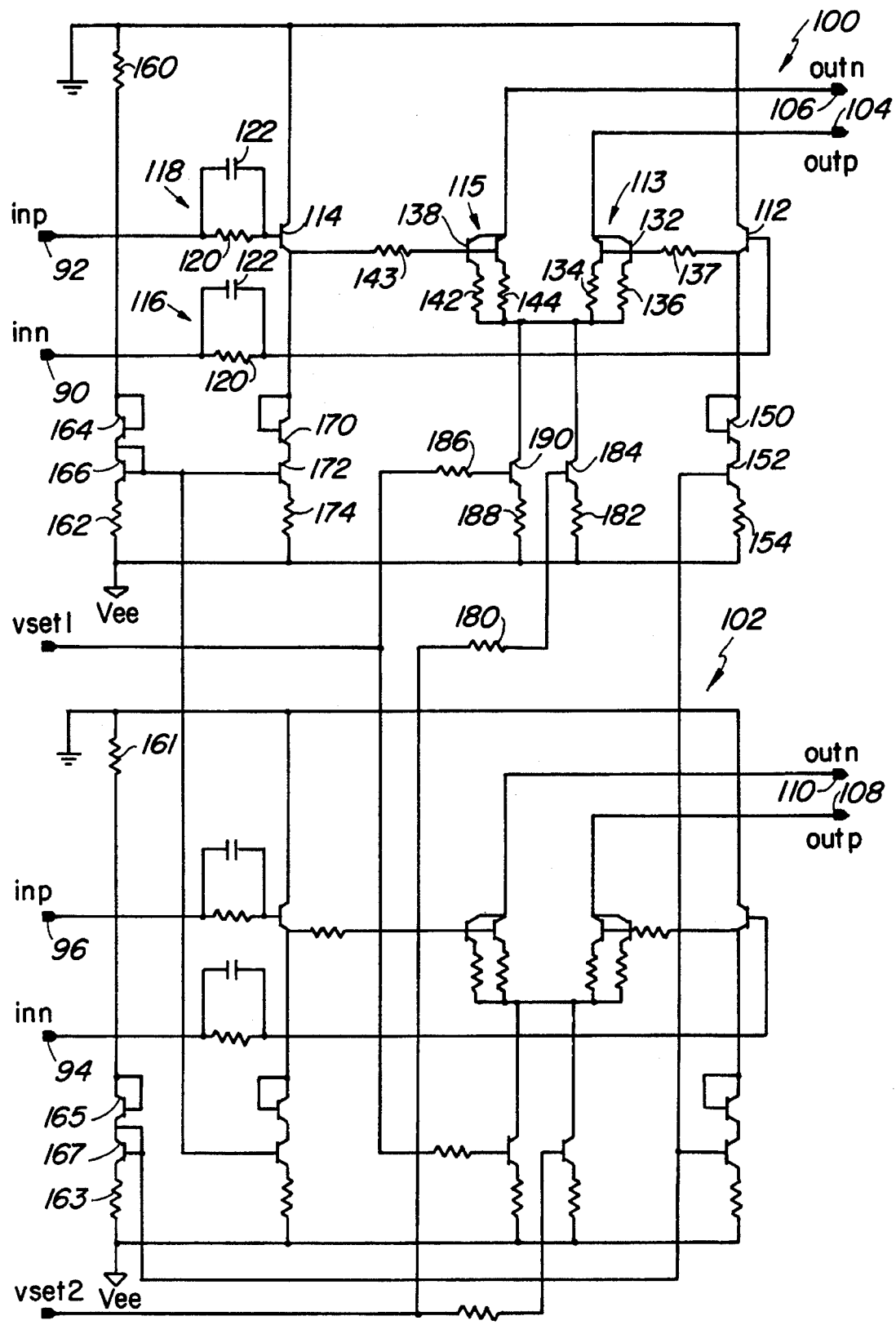
FIG. 4 is a circuit diagram of one distributed amplifier stage excluding the input and output transmission lines.

In FIG. 4 the differential output from the front end—lines 76,78 (FIG. 1) is used to provide an input signal to each gain block- Thus input transmission lines 87,89 in FIG. 3 are connected to input terminals 90,92 in gain block 100 and to input terminal 94,96 in gain block 102. Output 104 of gain block 100 and output 108 of gain block 102 are both connected to output transmission line 80. Similarly output 106 of gain block 100 and output 110 of gain block 102 are both connected to output transmission line 81.

Within each gain block, differential inputs drive two emitter followers 112,114 through R-C networks 116,118 comprising resistors 120 and capacitors 122. If the R-C networks 116,118 were not included, the capacitive nature of the input of the emitter followers, with a negative real part under certain switching conditions, would interact with the inductance of the input line to result in instability.

The emitter follower 112 drives arm 113 of an output differential pair comprising transistors 130,132 and resistors 134,136 through resistor 137 and emitter follower 114 drives the other arm 115 comprising transistors 138,140 and resistors 142,144 through resistor 143. Resistors 137 and 143 aid stability. Resistors 134,136 and 142,144 desensitize the gain of the differential stage. The fixed current mirror for emitter follower 112 comprises transistors 150,152 and resistor 154 via resistors 161,163 and transistors 165,167. The current mirror for emitter follower 114 comprises transistor 170,172 and resistor 174 via resistors 160,162 and transistors 164, 166.

Current mirror for the differential stage comprises resistors 180,182 and transistor 184 for differential arm 113 and current mirror for arm 115 comprises resistors 186,188 and transistor 190. The tail current of the differential output transistors are controlled by on-chip generated Vset1 and Vset2 lines, which are set by a d.c. reference current injected into the I.C. The two gain blocks 100,102 are connected in parallel. The output currents from the two gain blocks are summed together and flow to the same node at the output transmission lines. The differential pair is designed for full switching when responding to a sufficiently large input swing. Each transistor of the output differential pair carries a maximum current of approximately 6 mA when fully switched on providing a total maximum current of 120 mA for a five stage distributed amplifier.

The voltage at Vset or the d.c. current injected into Iset1 and Iset2 sets a vbias voltage at the current mirror of the front end which splits into Vset1 and Vset2 lines and feeds the current mirror of the five output stages of the distributed amplifier. This is best seen in the block diagram of the I.C. shown in FIG. 5. (Iset1 and Iset2 are normally connected together off-chip.)

The voltage at Vset or d.c. current into Iset1 and Iset2 control the tail current throughout the entire circuit. It controls not only the output swing of the distributed amplifier, but also controls the output swing of the front end and the sub-stages in the front end. This scheme sets the drive voltage into each differential pair in the I.C. to its optimal by minimizing an overdriving condition for each differential pair while making sure that each pair is fully switched for the designed range of output swing (1.5 V peak-to-peak per side to 3 V peak-to-peak per side). This results in a clean waveform at the output of the distributed amplifier under the designed range of output swing. To aid the generation of a clean waveform while keeping the output differential stages off the distributed amplifier fully switched, transistors 202, 204,206 and 208 in conjunction with resisters 212,214,216 and 218 (FIG. 1) supplies a small constant d.c. current into the output differential pair of the front end.

Transistors 222,224 and 226 as well as resisters 228 and 230 (also FIG.1) sense the vbias voltage and generate a d.c. monitoring voltage across vmon and vmon ref pads. This voltage is proportional to the output swing of the distributed amplifier so that an off-chip control circuit can sense the monitoring voltage and set the output swing as desired.

Figure 5:
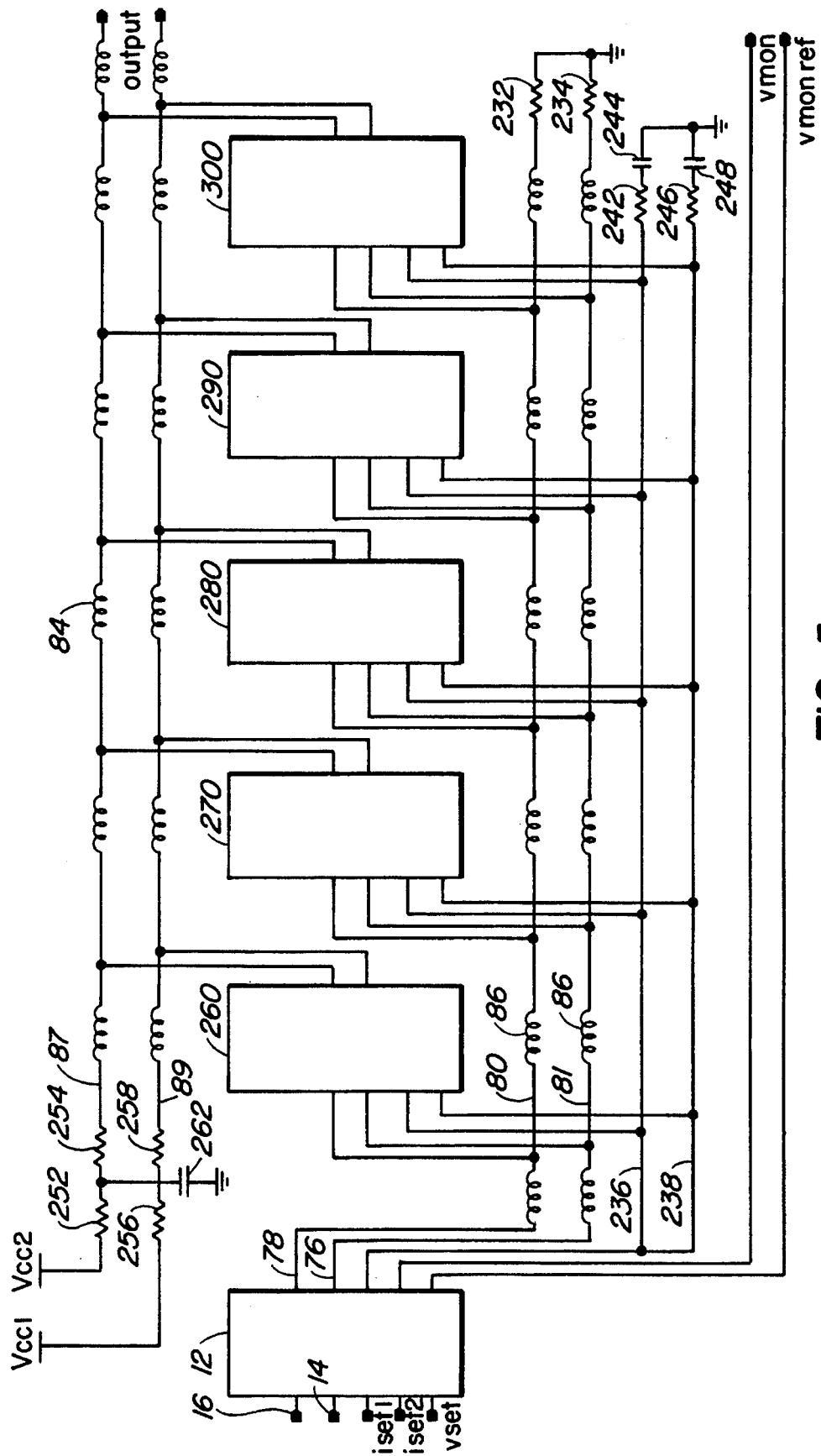
FIG. 5 is a block diagram of the differential distributed amplifier according to the present invention.

FIG. 5 is a schematic diagram of the complete distributed amplifier circuit. The input stage or front end 250 receives differential input signals at input terminals 14 and 16. The differential output of the front end at lines 76,78 is distributed to the input terminals of the distributed amplifier stages 260,270,280,290 and 300 on transmission line 81,80. The differential output of each distributed amplifier is supplied to output transmission lines 87,89. Inductors 84,86 appear between each stage as also shown in FIG. 3.

As shown in FIG. 5, the input transmission lines 80,81 are terminated by resistors 232,234. Vset1 and Vset2 lines 236,238 are a.c. terminated by resistor/capacitor networks 242,244 and 246,248 respectively. Output transmission lines 87,89 are pulled up to Vcc with an on-chip decoupling network comprising resistors 252,254,256,258 and capacitor 262.

The I.C. is insensitive to power and ground wirebond parasitics even though vias are absent in the HBT process. This is due no the mirror symmetry of the layout which can only be done in a fully-differential design. Most locally generated noise currents are designed to sum and cancel at the spot where they emerge, so that noise current does not propagate through the layout and interfere with other parts of the circuit. The I.C. is also insensitive to power supply variations because of the differential structure.

Although a particular embodiment of the invention has been described and illustrated, it will be apparent to one skilled in the art that various modifications and alternatives can be introduced to the basic concept. It is intended that such modifications and alternatives will be encompassed in the appended claims.

I claim:

1. A limiting, distributed amplifier circuit for supplying a high frequency differential output, said circuit comprising:

a limiting output amplifier having a plurality of interconnected distributed amplifier stages, each of said amplifier stages having input means to receive a high frequency differential input and output means to provide an amplified limiting differential output;

a pair of input transmission lines for delivering said high frequency differential input to each of said distributed amplifier stages;

a pair of output transmission lines for receiving said amplified limiting differential output from each of said distributed amplifier stages and combining said outputs to provide said high frequency differential output; and bias means to provide a d.c. bias current to each of said distributed amplifier stages to control the amplitude of said high frequency differential output.

2. A limiting distributed amplifier circuit as defined in claim 1, further comprising an integrated input differential amplifier having input terminals for receiving a high frequency input signal and amplifier means to deliver a high frequency differential signal into said input transmission lines.

3. A limiting distributed amplifier circuit as defined in claim 2, said input differential amplifier being operated to deliver a limited, high frequency differential signal.

4. A limiting distributed amplifier circuit as defined in claim 1, said d.c. bias current being adjustable to reduce said differential output to zero.

5. A limiting, distributed amplifier circuit for supplying a high frequency differential output comprising:

an integrated input differential amplifier having input terminals for receiving a high frequency differential input signal and amplifier means for providing limited differential output;

an output amplifier having a plurality of interconnected distributed amplifier stages, each of said stages having a pair of gain blocks connected in parallel, wherein each block has input means to receive said limited differential output from said input amplifier and means to provide an amplified differential output;

a pair of input transmission lines from said input amplifier for delivering said limited differential output to each of said gain blocks;

a pair of output transmission lines for receiving said amplified, differential outputs from said gain blocks; and bias means to provide a d.c. bias current to said output amplifier and said distributed amplifier for controlling the amplitude of said high frequency differential output.

6. A limiting distributed amplifier circuit as defined in claim 5, fabricated with a AlGaAs/GaAs heterojunction bipolar transistor (HBT) process.

7. A limiting distributed amplifier circuit as defined in claim 5, fabricated with a InGaP/GaAs heterojunction bipolar transistor (HBT) process.

8. A limiting, differential distributed amplifier circuit as defined in claim 5, fabricated with a GaAs MESFET process.

9. A limiting differential distributed amplifier circuit as defined in claim 5, fabricated with a HEMT process.

10. A limiting distributed amplifier circuit as defined in claim 5, said high frequency differential output being used to drive a III–V Mach-Zehnder optical modulator.

11. A limiting distributed amplifier as defined in claim 10, said differential output being in the range 0 volts to 5.0 volts peak-to-peak.

12. A limiting, distributed amplifier as defined in claim 1, each of said distributed amplifier stages having a gain block.

13. A limiting, distributed amplifier as defined in claim 1, each of said distributed amplifier stages having a plurality of gain blocks connected in parallel.

\* \* \* \* \*